March 30, 1971 B. TOPAS 3,573,115
SEALED TUBE DIFFUSION PROCESS
Filed April 22, 1968

INVENTOR.
BENJAMIN TOPAS
BY
Ostrolenk, Faber, Gerb & Soffen
ATTORNEYS

United States Patent Office 3,573,115

Patented Mar. 30, 1971

3,573,115

SEALED TUBE DIFFUSION PROCESS

Benjamin Topas, Santa Monica, Calif., assignor to International Rectifier Corporation, Los Angeles, Calif.

Filed Apr. 22, 1968, Ser. No. 723,208

Int. Cl. H01l 7/36

U.S. Cl. 148—189 2 Claims

ABSTRACT OF THE DISCLOSURE

A stack of semiconductor wafers is placed in a diffusion boat which is loaded into a quartz tube. The tube is filled with a predetermined volume of gas containing doping agents alone, or doping agents and oxygen, and the tube is sealed. The tube is then heated at a relatively low temperature in a diffusion chamber to cause initial decomposition of the doping materials on the wafers, and thereafter at a higher temperature to cause diffusion of the doping materials into the wafer as well as oxidation of the wafer surface.

This invention relates to a process for the manufacture of semiconductor devices, and more particularly relates to a novel diffusion and oxide passivation process carried out in a closed tube containing a predetermined volume of doping agents and oxygen in a gaseous mixture.

The formation of P-N junctions in semiconductor wafers by gaseous diffusion, and the coating of the wafers with an oxide of the semiconductor to protect the junction at the surface of the wafer or to form various types of insulation barriers is well known. In one known process, a gas mixture containing the desired compounds for doping and oxidation is continuously passed through a heated tube containing a stack of wafers. In this process, one plate acts as a baffle for the other so that the doping gas does not deposit evenly on all the wafers of the stack. Therefore, uniform diffusion of the wafers in the stack is not obtained. In another known process, the tube is sealed and the desired gas is obtained from the decomposition of a suitable solid loaded into the tube. The solid must be heated to a temperature different from the wafer temperature, so that there is a temperature gradient along the wafer stack, leading to non-uniform diffusion along the stack.

Thus, when using such prior art proceses, it is very difficult to control the surface concentration of the diffusants, the junction depth, and the oxide layer thickness, especially when processing a large number of wafers, formed in a stack. That is, the wafers at the center of the stack will vary considerably from the wafers toward the ends of the stack in junction depth, diffusant surface concentration and coating thickness.

In accordance with the present invention, a large stack of wafers, typically twenty-five wafers, is loaded into a boat and the boat is sealed in a quartz tube along with a gaseous mixture comprising a concentration of the desired diffusant, oxygen, and an inert gas in certain proportions. The system is then heated, first to decompose the diffusant gas and coat the surfaces of the wafers which are to receive the diffusant, and thereafter to drive the diffusant into the wafers and to coat the wafers with an oxide coating. Exceptionally good control of junction depth, surface concentration of the diffusant, and oxide thickness have been obtained in this manner. Moreover, even though no special care is exercised in loading the wafers on the boat, and they may be in apparent surface-to-surface contact, the wafers are consistent in their junction depth, surface concentration and oxide coating thickness, regardless of their position in the stack. Thus, it becomes possible with the present invention to fabricate a large number of wafers in a single operation with the wafers having practically identical junction and coating characteristics.

Therefore, a primary object of this invention is to provide a novel diffusion method for semiconductor wafers in which a large number of wafers can be handled at one time.

Another object of this invention is to provide a novel diffusion method which provides good control of junction depth.

A further object of this invention is to provide a novel diffusion method which permits independent control of both junction depth and oxide coating thickness.

Figure 1:
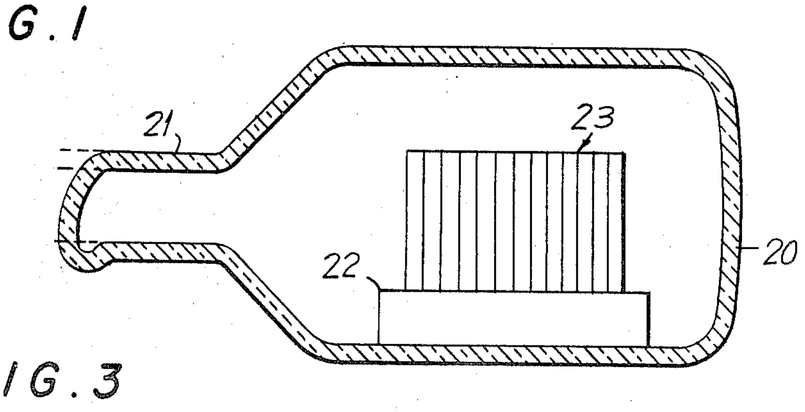
FIG. 1 shows a schematic cross-section view of a stack of wafers sealed in a gas filled tube.

Referring to FIG. 1, there is illustrated a quartz container or tube 20 which has a normally open mouth 21 sufficiently large to receive a boat 22 loaded with a stack of silicon wafers 23. Typically, twenty-five wafers can be contained in stack 23 and they may be stacked directly adjacent one another on boat 22. Tube 20 may have a volume of about ¼ liter, after sealing.

Figure 3:
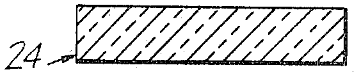
FIG. 3 is a cross-sectional view of FIG. 2 taken across the section line 3—3 in FIG. 2.
Figure 2:
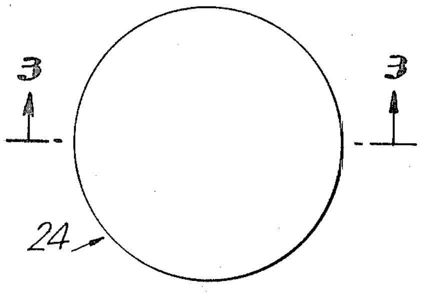
FIG. 2 shows a top view of one of the wafers contained in the tube of FIG. 1.

FIGS. 2 and 3 show a wafer 24 which can be used in the stack 23 where wafer 24 typically may be of N-type silicon having a diameter of 1 inch and a thickness of about 15 mils. The wafer is suitably prepared for diffusion in the usual manner. After loading the wafer 24 into the boat 22 and loading the boat 22 into tube 20, the interior of tube 20 is flushed with an inert gas to evacuate air therefrom, and the tube 20 is thereafter loaded with a mixture of an inert gas and an impurity-containing gas. In addition, and as will be described hereinafter, oxygen may also be contained in the gas filling tube 20 for forming an oxide coating on the wafer during the diffusion cycle. As a typical example, after flushing, tube 20 is loaded with diborane ($B_2H_6$) and argon with the diborane having a partial pressure of 50 millimeters at 25° C. and the argon having a partial pressure of 250 millimeters at 25° C. The specific concentration of the doping gas depends on the total surface area to be coated, and thus depends on the number of wafers in the stack and their area.

The quartz tube 20 then has its neck 21 sealed closed, as shown in FIG. 1, in order to seal the predetermined quantity of gas within the tube 20. It is to be noted that other inert gases could be used and other impurity-carrying gases, such as phosphine, could have been used for N-type diffusion.

Figure 4:
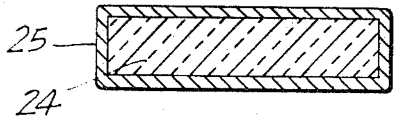
FIG. 4 shows a coating of an impurity-containing compound deposited on the wafer of FIG. 3 after a first heating cycle of the stack of wafers in FIG. 1.

The quartz tube 20 is then loaded into a diffusion furnace and is initially heated to about 950° C. to cause reduction of the diborane and the coating of wafer 24 with a boron layer 25, as shown in FIG. 4. The temperature is then increased to about 1250° C. and maintained at 1250°

Figure 5:
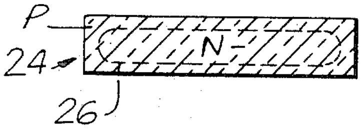
FIG. 5 shows the formation of the junction in the wafer of FIG. 4 with increased heating.

C. in order to diffuse the boron into the surfaces of wafer 24; forming the junction 26, shown in FIG. 5, between the N-type interior and P-type exterior of wafer 24.

The surface concentration of wafer 24 at the end of this diffusion will be about 31.5, for example, while the junction depth is about 18 microns. Moreover, these figures will be constant in any given run for wafers regardless of their position in stack 23, whereas prior diffusion techniques would yield varying boron diffusion depths and surface concentrations within the length of the stack. The wafers will also have a uniform sheet resistance; within about 2% over the entire twenty-five wafers.

In the arrangement wherein oxygen is also included in the gas, after the depositioning of the boron layer 25 and the increase in temperature to a diffusion level, the silicon surface begins to oxidize while the impurities are being diffused into the wafer. The concentration of oxygen is selected in accordance with the desired thickness of the silicon oxide layer which is to be formed. In this arrangement, the wafer will have the appearance of FIG. 6, similar to the wafer of FIG. 5 in surface concentration and junction depth, except that a silicon oxide layer 27 is formed on the wafer at the same time that the junction 26 is being formed.

Figure 6:
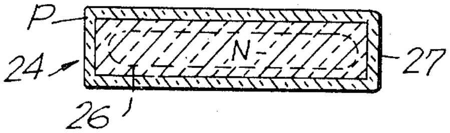
FIG. 6 shows the wafer of FIG. 5 after the formation of a silicon oxide coating thereon.
Figure 8:
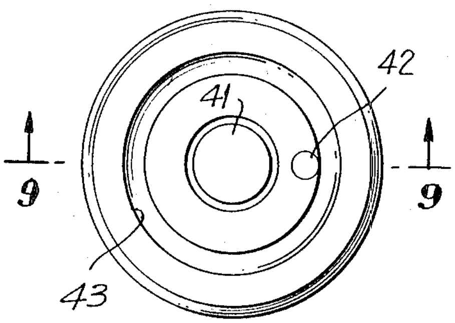
FIG. 8 shows a top view of the wafer of FIG. 7 after the formation of a junction-separating groove, and the application of electrodes to the wafer.
Figure 7:
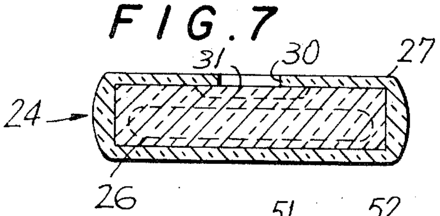
FIG. 7 shows the wafer of FIG. 6 after forming an opening in the oxide coating and the diffusion of a further junction therein.

After the completion of the wafer of FIG. 5 or FIG. 6, standard techniques are employed for the formation of a third junction to adapt the device to the structure of a controlled rectifier. For example, in FIG. 7 an opening 30 is formed in oxide layer 27 and a second diffusion operation is performed on the wafer to diffuse an N-type impurity through opening 30 to form junction 31 which is of the planar type. Note that a similar junction could be formed for the wafer of FIG. 5 using suitable masking techniques so that a planar junction 31 would be formed in the top of the wafer.

Figure 9:
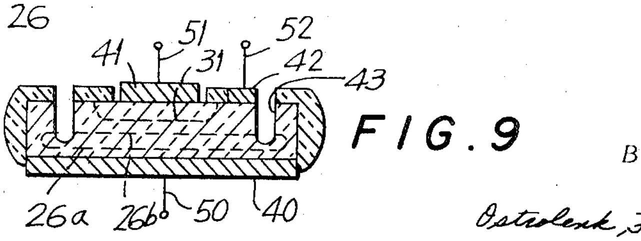
FIG. 9 is a cross-sectional view of FIG. 8 across the section line 9—9 in FIG. 8.

Thereafter, the lower portion of oxide layer 27 is removed and a bottom anode electrode 40 is connected to the bottom of the wafer while a cathode electrode 41 is connected within junction 31. A small portion of the upper surface of coating 27 is also removed to permit connection of the gate electrode 42 to the device. An annular notch 43 is then etched around the outer periphery of the device to form two parallel junctions of the originally enclosed junction 26 (shown as junctions **26*a* and 26*b* in FIG. 9). The completed device is then available for assembly into a suitable housing through which anode, cathode and gate leads 50, 51 and 52** extend.

While the foregoing figures describe the present invention as applied to the manufacture of a controlled rectifier device, it will be apparent that any desired type device could be formed. For example, in the embodiments of FIG. 5, a diode could be formed by lapping the bottom of wafer 24 to a depth beyond the lower surface of junction 26 with electrodes connected to the upper and lower surfaces of the device.

Although this invention has been described with respect to particular embodiments, it should be understood that many variations and modifications will now be obvious to those skilled in the art, and, therefore, the scope of the invention is limited not by the specific disclosure herein, but only by the appended claims.

I claim:

1. The process of diffusing a junction in a semiconductor wafer comprising: loading of said wafer into a chamber, filling said chamber with a gas mixture comprised of a doping gas of a given concentration, oxygen, and an inert gas, the partial pressure of said inert gas being greater than the partial pressure of said doping gas, sealing said chamber, and heating said chamber and said wafer to a first temperature for decomposing said doping gas to deposit a doping material on the surface of said wafer, and thereafter, at a second and higher temperature, diffusing said doping material into said wafer for a given depth; said second temperature being high enough to cause said oxygen to combine with the surface of said wafer to form an oxide coating thereon during the diffusion process.

2. The process of diffusing a junction in a plurality of stacked semiconductor wafers comprising: loading of said wafer into a chamber, filling said chamber with a gas mixture comprised of a doping gas of a given concentration, oxygen, and an inert gas, the partial pressure of said inert gas being greater than the partial pressure of said doping gas, sealing said chamber, and heating said chamber and said plurality of stacked semiconductor wafers to a first temperature for decomposing said doping gas to deposit a doping material on the surface of said plurality of stacked semiconductor wafers, and thereafter, at a second and higher temperature, diffusing said doping material into said plurality of stacked semiconductor wafers for a given depth; said second temperature being high enough to cause said oxygen to combine with the surface of said wafer to form an oxide coating thereon during the diffusion process.

References Cited

UNITED STATES PATENTS

| | | | |
|---|---|---|---|
| 2,928,761 | 3/1960 | Gremmelmaier et al. | 148—189 |
| 3,015,590 | 1/1962 | Fuller | 148—189 |
| 3,260,626 | 7/1966 | Schink | 148—188 |
| 3,279,963 | 10/1966 | Castrucci et al. | 148—188 |
| 3,314,832 | 4/1967 | Raithel | 148—189 |
| 3,391,035 | 7/1968 | Macintosh | 148—189 |
| 3,418,182 | 12/1968 | Forrest | 148—188 |
| 3,484,314 | 12/1969 | Bohne et al. | 148—189 |

L. DEWAYNE RUTLEDGE, Primary Examiner

R. A. LESTER, Assistant Examiner

U.S. Cl. X.R.

148—186, 187, 188